(12) United States Patent
Igarashi

(10) Patent No.: US 6,904,572 B2
(45) Date of Patent: Jun. 7, 2005

(54) METHOD, APPARATUS AND PROGRAM FOR DESIGNING A SEMICONDUCTOR INTEGRATED CIRCUIT BY ADJUSTING LOADING OF PATHS

(75) Inventor: Mutsunori Igarashi, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 140 days.

(21) Appl. No.: 10/378,731

(22) Filed: Mar. 3, 2003

(65) Prior Publication Data

US 2003/0167451 A1 Sep. 4, 2003

(30) Foreign Application Priority Data

Mar. 4, 2002 (JP) ..................................... P2002-057227

(51) Int. Cl.⁷ .............................................. G06F 17/50
(52) U.S. Cl. ..................... 716/2; 716/1; 716/6; 716/13
(58) Field of Search ............................. 716/1, 2, 6, 13, 716/5

(56) References Cited

U.S. PATENT DOCUMENTS

| | | | |
|---|---|---|---|
| 5,235,521 A | 8/1993 | Johnson et al. ................ | 716/6 |
| 6,550,050 B2 * | 4/2003 | Hosono et al. ............... | 716/13 |
| 2001/0049814 A1 * | 12/2001 | Matsumoto et al. .......... | 716/10 |

FOREIGN PATENT DOCUMENTS

| | | |
|---|---|---|
| JP | 10-125788 | 5/1998 |
| JP | 10-214941 | 8/1998 |

OTHER PUBLICATIONS

Notice of Grounds for Rejection mailed on Jun. 8, 2004 corresponding to Japanese Patent Application No. 2002–057227 as received from the Japenese Patent Office.

* cited by examiner

Primary Examiner—Thuan Do
(74) Attorney, Agent, or Firm—DLA Piper Rudnick Gray Cary US LLP

(57) ABSTRACT

A computer-implemented method for designing a semiconductor integrated circuit, which optimizes the propagation delay of a path from a signal input terminal (source) to a signal output terminal (sink) on the same net, includes: calculating the ratio of the total sum of a gate input load capacitance to the wiring capacitance of the path from the source to the sink as a process variation sensitivity relating to the capacitance component of the path to be designed from the source to the sink, based on a circuit design information of a gate level of the semiconductor integrated circuit to be designed; and optimizing the process variation sensitivity relating to the capacitance component of each path in order that the process variation sensitivities relating to the capacitance components of all the paths are smaller than a reference value.

17 Claims, 12 Drawing Sheets

FIG.5A
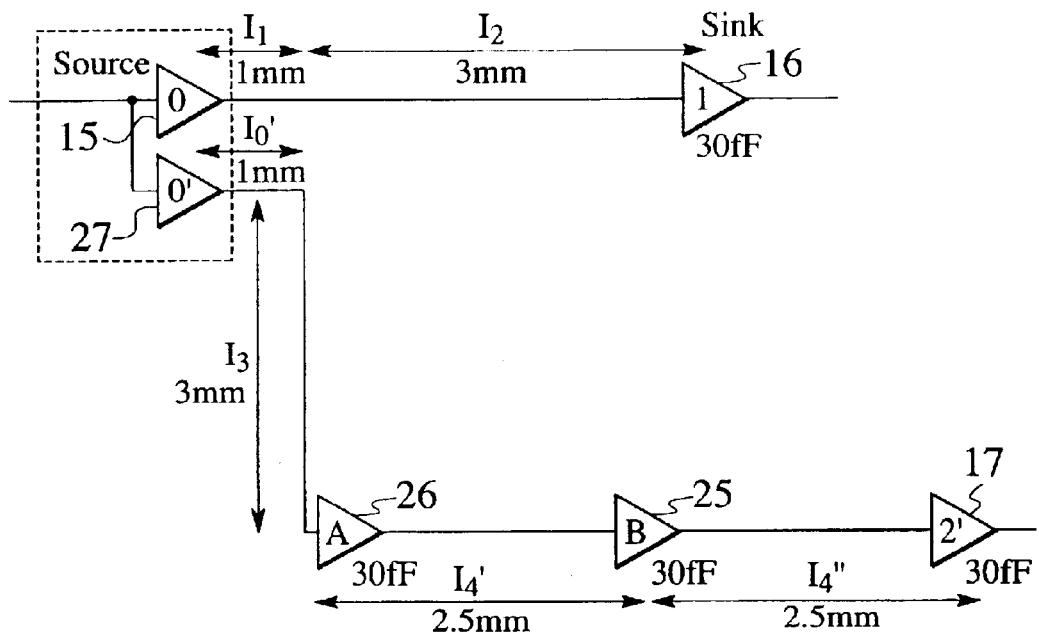
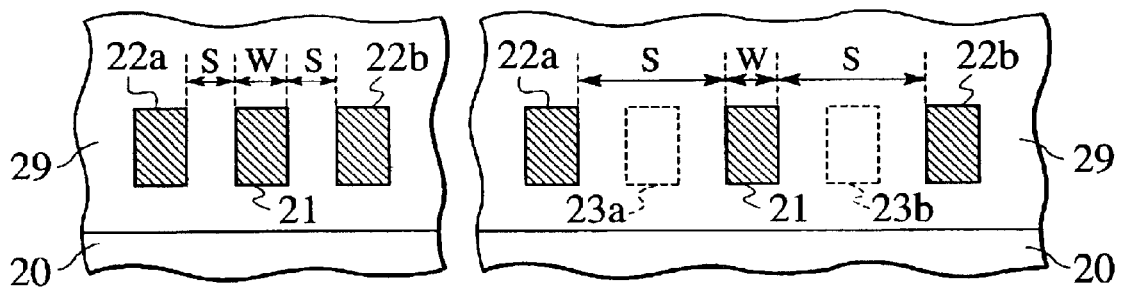
FIG.5B  FIG.5C

FIG.8A
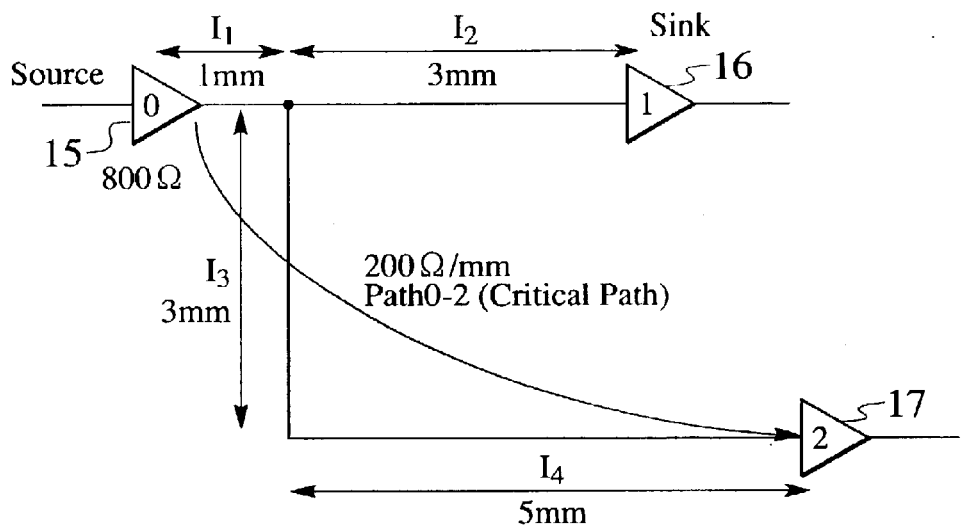
FIG.8B
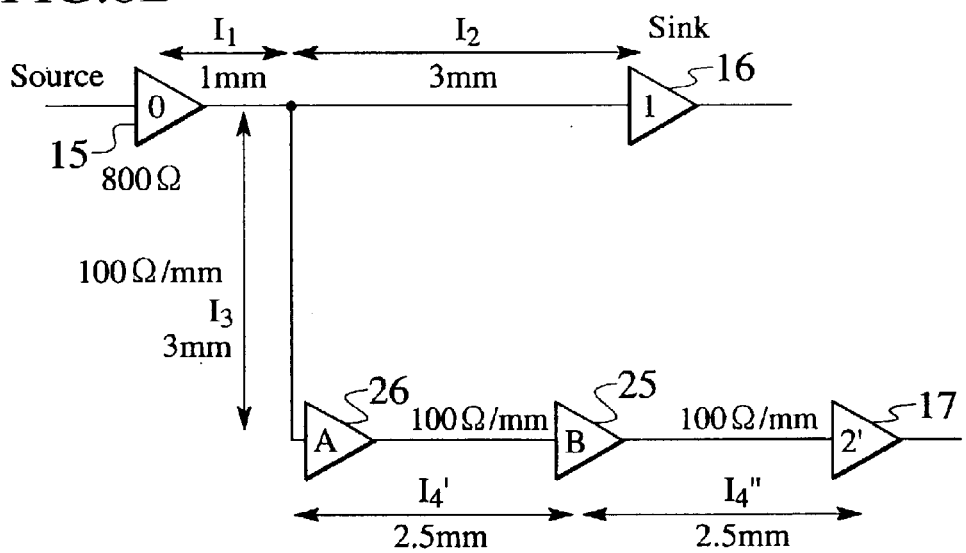
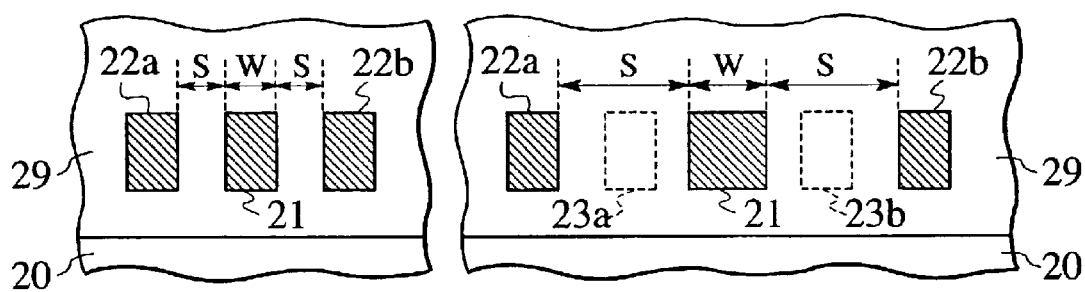
FIG.8C    FIG.8D

FIG.9A
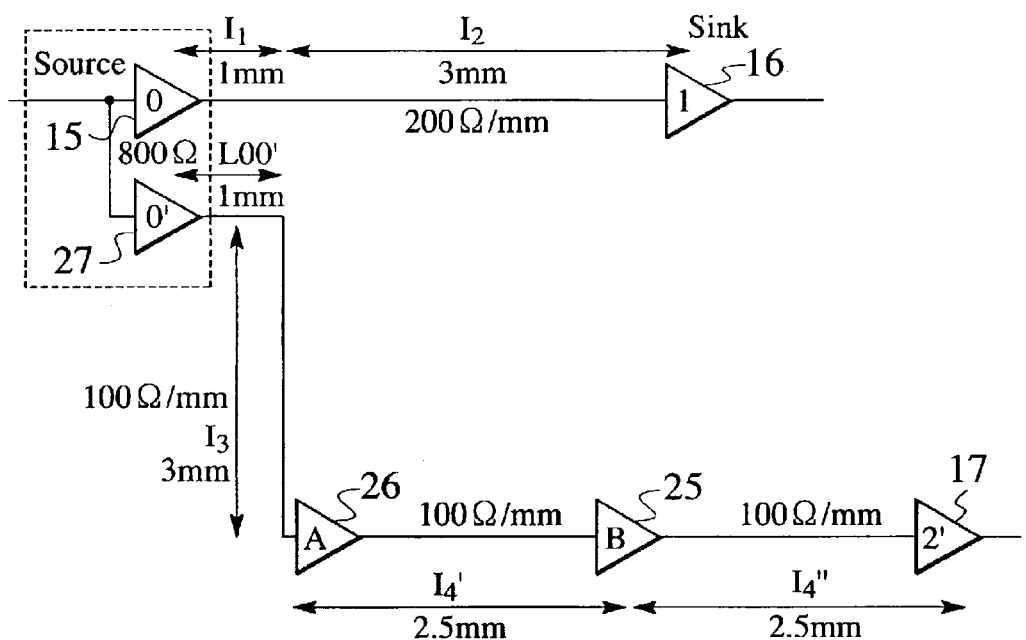
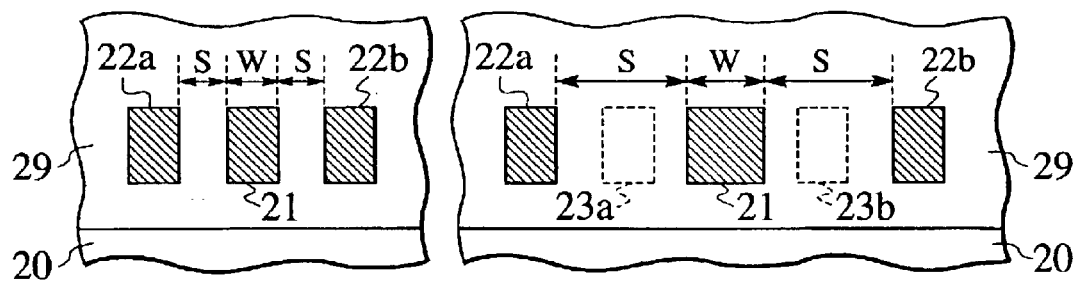
FIG.9B FIG.9C

METHOD, APPARATUS AND PROGRAM FOR DESIGNING A SEMICONDUCTOR INTEGRATED CIRCUIT BY ADJUSTING LOADING OF PATHS

CROSS REFERENCE TO RELATED APPLICATIONS

This application claims benefit of priority under 35 USC §119 to Japanese Patent Application No. 2002-057227 filed on Mar. 4, 2002, the entire contents of which are incorporated by reference herein.

BACKGROUND OF THE INVENTION

1. Field of the Invention

The present invention pertains to a technology for designing a semiconductor integrated circuit using a computer system. In particular, the present invention pertains to a computer-implemented method, an apparatus and a program for designing a semiconductor integrated circuit in consideration of process variations when designing the semiconductor integrated circuit by the use of an Electronic Design Automation (EDA) tool.

2. Description of the Related Art

In designing a semiconductor integrated circuit, it is necessary to control the time (signal propagation delay time), that a signal takes to propagate from a signal input terminal called a source, to a signal output terminal called a sink, of all the signal paths of the circuit via wirings and devices, within a required range.

On the other hand, as the semiconductor integrated circuit has been more finely patterned, so process variations in manufacturing further affect circuit delay characteristics. For example, the delay time T of a gate can be simply expressed by a product $R_{on} \times C$ of on-state resistance $R_{on}$ and capacitance C, and if a polysilicon gate length W and a channel length L are changed slightly in size during a process, they affect the performance of a cell.

In a design technology in the related art, the effects of such process variations have been taken into account (for example, by making one parameter $K_p$ typify process variation relating to the polysilicon gate length W, and by multiplying the delay time T of the gate by the parameter $K_p$), in designing the semiconductor integrated circuit. The parameter $K_p$ has been set under the worst condition based on an experimental value.

However, in the related art, for example, the gate length W was comparatively large with respect to the variation of the gate length W, so that the effect of the process variation could be allowed by multiplying the delay time T of the gate by the parameter $K_p$, as described above, but as the circuit has been more finely pattered and further speeded up, so there is little allowance left for the effect of the process variation.

Further, as the ratio of a wiring delay in circuit delay characteristics increases with finer patterning in a semiconductor process, so the effect of process variation relating to a wiring layer cannot be neglected. This is because the delay caused by wiring becomes larger than the inner delay of a cell and occupies a major portion of the total path delay.

Therefore, it is necessary to take into account, even during the steps of designing, the effect of fluctuations in the wiring capacitance C and the wiring resistance R caused by the process variations, but at present there are no such design techniques or a technical guidelines.

SUMMARY OF THE INVENTION

A computer-implemented method for designing a semiconductor integrated circuit, which optimizes the propagation delay of a path from a signal input terminal called a source, to a signal output terminal called a sink, on the same net, according to an embodiment of the invention includes: calculating the ratio of the total sum of a gate input load capacitance to the wiring capacitance of the path from the source to the sink as a process variation sensitivity relating to the capacitance component of the path to be designed from the source to the sink, based on a circuit design information of a gate level of the semiconductor integrated circuit to be designed; and optimizing the process variation sensitivity relating to the capacitance component of each path in order that the process variation sensitivities relating to the capacitance components of all the paths are smaller than a reference value.

A computer implemented method for designing a semiconductor integrated circuit, which optimizes the propagation delay of a path from a signal input terminal called a source, to a signal output terminal called a sink, on the same net, according to another embodiment of the invention includes: calculating the ratio of a gate resistance to the wiring resistance of the path from the source to the sink as a process variation sensitivity relating to the resistance component of the path to be designed from the source the sink, based on a circuit design information of a gate level of the semiconductor integrated circuit to be designed; and optimizing the process variation sensitivity relating to the resistance component of each path in order that the process variation sensitivities relating to the resistance components of all the paths are smaller than a reference value.

An apparatus for designing a semiconductor integrated circuit, which optimizes the propagation delay of a path from a signal input terminal called a source, to a signal output terminal called a sink, on the same net, according to an embodiment of the invention includes: a memory section configured to store a circuit design information of a gate level of the semiconductor integrated circuit to be designed; a processing section configured to calculate the ratio of the total sum of a gate input load capacitance to the wiring capacitance of the path from the source to the sink as a process variation sensitivity relating to the capacitance component of the path to be designed from the source to the sink, based on the circuit design information and to optimize the process variation sensitivity relating to the capacitance component of each path in order that the process variation sensitivities relating to the capacitance components of all the paths are smaller than a reference value.

An apparatus for designing a semiconductor integrated circuit, which optimizes the propagation delay of a path from a signal input terminal called a source, to a signal output terminal called a sink, on the same net, according to another embodiment of the invention includes: a memory section configured to store a circuit design information of a gate level of the semiconductor integrated circuit to be designed; a processing section configured to calculate the ratio of a gate resistance to the wiring resistance of the path from the source to the sink as a process variation sensitivity relating to the resistance component of the path to be designed from the source to the sink, based on the circuit design information and to optimize the process variation sensitivity relating to the resistance component of each path in order that the process variation sensitivities relating to the resistance components of all the paths are smaller than a reference value.

A program for designing a semiconductor integrated circuit, which optimizes the propagation delay of a path from a signal input terminal called a source, to a signal output terminal called a sink, on the same net, according to an embodiment of the invention includes: determining a wiring structure in the net by obtaining a wiring length in the net based on a circuit design information of a gate level of the semiconductor integrated circuit to be designed; calculating the ratio of the total sum of a gate input load capacitance to the wiring capacitance of the path from the source to the sink as a process variation sensitivity relating to the capacitance component of the path to be designed from the source to the sink, based on the circuit design information and adjusting a wiring capacitance load for a path in which the process variation sensitivity relating to the capacitance component is larger than a reference value, to reduce the process variation sensitivity relating to the capacitance component of the path, to thereby optimize the process variation sensitivity relating to the capacitance component of each path in order that the process variation sensitivities relating to the capacitance components of all the paths are smaller than the reference value in the case where the wiring structure in the net is a local wiring; and calculating the ratio of a gate resistance to the wiring resistance of the path from the source to the sink as a process variation sensitivity relating to the resistance component of the path to be designed from the source to the sink, based on the circuit design information and adjusting a wiring capacitance load for a path in which the process variation sensitivity relating to the resistance component is Larger than a reference value, to reduce the process variation sensitivity relating to the resistance component of the path, to thereby optimize the process variation sensitivity relating to the resistance component of each path in order that the process variation sensitivities relating to the resistance components of all the paths are smaller than the reference value in the case where the wiring structure in the net is a global wiring.

BRIEF DESCRIPTION OF THE DRAWINGS

FIG. 3A shows a circuit in which the delay is not yet improved and FIG. 3B shows a circuit in which the delay is improved by inserting a buffer cell.

FIG. 4A shows an example of setting numerical values to the circuit in which the delay is not yet improved. FIG. 4B shows an example of the circuit setting numerical values in which the delay is improved by inserting buffer cells.

FIG. 5A is an illustration showing a circuit having a signal path from a source to a sink, for explaining an example of calculating a process variation sensitivity relating to a capacitance component. FIG. 5A shows the circuit copying a driver cell and dividing a path to optimize process variation sensitivity. FIG. 5B shows wirings of the signal path before widening a wiring pitch. FIG. 5C shows wirings of the signal path after widening a wiring pitch to optimize process variation sensitivity.

FIGS. 8A, 8B are illustrations each showing a circuit having a signal path from a source to a sink, for explaining an example of calculating a process variation sensitivity relating to a resistance component. FIG. 8A shows an example of setting numerical values to the circuit in which the delay is not yet improved. FIG. 8B shows an example of the circuit setting numerical values in which the delay is improved by inserting buffer cells. FIG. 8C shows wirings of the signal path before enlarging a wiring width. FIG. 8D shows wirings of the signal path after enlarging a wiring width to optimize process variation sensitivity.

FIG. 9A is an illustration showing a circuit having a signal path from a source to a sink, for explaining an example of calculating a process variation sensitivity relating to a resistance component. FIG. 9A shows the circuit copying a driver cell and dividing a path to optimize process variation sensitivity. FIG. 9B shows wirings of the signal path before enlarging a wiring width. FIG. 9C shows wirings of the signal path after enlarging a wiring width to optimize process variation sensitivity.

DETAILED DESCRIPTION

Figure 1:
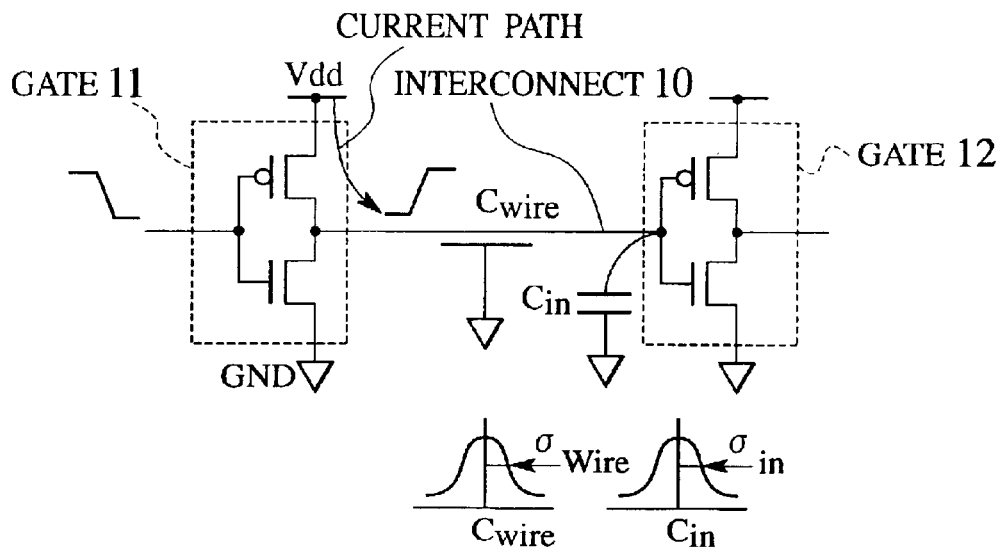
FIG. 1 is an illustration showing an example of a circuit having inverters arranged in series in a two-terminal net, for explaining an example of the definition of a process variation sensitivity relating to a capacitance component.

Embodiments of the invention will be described herein below with reference to the drawings, and with respect to coordinate transformation of a semiconductor memory cell as an example. It is to be noted that the same or similar reference numerals are applied to the same or similar parts and elements throughout the drawings, and the description of the same or similar parts and elements will be omitted or simplified.

In the embodiments shown in the following, a method, an apparatus and a program for designing a semiconductor integrated circuit, which are able to suppress the effect of fluctuation of propagation delay caused by process variations, will be shown.

Thus, in the embodiments shown in the following, the ratio of the total sum of a gate input load capacitance to the wiring capacitance of a path from a signal input terminal (source) to a signal output terminal (sink) on the same net is calculated as a process variation sensitivity relating to the capacitance component of the path to be designed from the source to the sink. Further, a wiring capacitance load is adjusted for a path in which the process variation sensitivity relating to the capacitance component is larger than a reference value in order to reduce the process variation sensitivity relating to the capacitance component of the path, to thereby optimize the process variation sensitivity relating to the capacitance component of each path such that the process variation sensitivities relating to the capacitance components of all the calculated paths are smaller than the reference value. In order to adjust the wiring capacitance load, (1) the gap between neighboring wirings is widened, (2) wiring in an upper wiring layer is used, and (3) a cell which is to be a route driver is copied and a signal path is divided.

In addition, in the embodiments shown in the following, the ratio of a gate resistance to the wiring resistance of the path from a signal input terminal (source) to a signal output terminal (sink) is calculated as a process variation sensitivity relating to the resistance component of the path to be designed from the source to the sink. Further, a wiring capacitance load is adjusted for a path in which the process variation sensitivity relating to the resistance component is larger than a reference value to reduce the process variation sensitivity relating to the resistance component of the path to thereby optimize the process variation sensitivity relating to the resistance component of each path such that the process variation sensitivities relating to the resistance components of all the calculated paths are smaller than the reference value. In order to adjust the wiring resistance load, (1) a wiring width is enlarged, (2) a buffer cell is inserted, and (3) a cell which is to be a route driver is copied and a signal path is divided.

Here, a "net" means connection information between the terminals of a logic cell and a pair of terminals that are to be connected to each other by a common wiring and the wiring belonging to the same net.

A "path" means a path between a starting point and an ending point, and in a logic circuit, the starting point is a signal input terminal (source) and the ending point is a signal output terminal (sink). In this connection, even if paths have the same signal input terminal and the same signal output terminal, if the paths are different in the route between the signal input terminal and the signal output terminal, the paths form different paths.

Further, a "local wiring" means a wiring having a short wiring length, for example, shorter than 1 mm, and a "global wiring" means a wiring having a long wiring length, for example, not shorter than 1 mm. In the local wiring, the variation of the capacitance load affects the delay time considerably. In the global wiring, the variation of the wiring resistance component affects the delay time considerably.

Still further, an "upper wiring layer" means a wiring layer far from a substrate, whereas a wiring layer near to the substrate is called a "lower wiring layer: for example, in a metal layer including five layers, the upper wiring layer means the third or more layer from the substrate.

Definition of Process Variation Sensitivity

FIG. 1 shows an example in which inverters are arranged in series in a two-terminal net having no branch and shows process variations relating to wiring 10 and process variations relating to a gate input capacitance load. In FIG. 1, a previous gate 11 is a driver cell and a latter gate 12 is a driven cell. Assume that a part denoted by wiring load capacitance $C_{wire}$ and a part denoted by a gate input capacitance $C_{load}$ have different process variations, respectively.

To begin with, according to the Elmore Delay Model, a delay taking into account variations $\Delta C_{wire}$ and $\Delta C_{load}$, which are caused by the process variations of the wiring load capacitor $C_{wire}$ and the gate input capacitor $C_{load}$, is expressed by the following equation.

$$\begin{aligned}\text{Delay} = &(R_g + \Delta R_g)\{(C_{wire} + \Delta C_{wire})L_{wire} + (C_{load} + \Delta C_{load})\} + \frac{1}{2}(R_{wire} + \Delta R_{wire})(C_{wire} + \Delta C_{wire})L_{wire}^2 + \\ &(R_{wire} + \Delta R_{wire})L_{wire}(C_{load} + \Delta C_{load}) \\ = &R_g(C_{wire}L_{wire} + C_{load}) + \frac{1}{2}R_{wire}C_{wire}L_{wire}^2 + R_{wire}L_{wire}C_{load} \\ &+ R_g(\Delta C_{wire}L_{wire} + \Delta C_{load}) + \Delta R_g(C_{wire} + \Delta C_{wire})L_{wire} + \Delta R_g(C_{load} + \Delta C_{load}) + \\ &\frac{1}{2}L_{wire}^2(R_{wire}\Delta C_{wire} + \Delta R_{wire}C_{wire} + \Delta R_{wire}\Delta C_{wire}) + (R_{wire}\Delta C_{load} + \Delta R_{wire}C_{load} + \Delta R_{wire}\Delta C_{wire})L_{wire}\end{aligned} \quad (1)$$

where $R_g$ is a gate resistance, $R_{wire}$ is a wiring resistance, and $L_{wire}$ is a wiring length.

Neglecting the secondary variable terms in the above equation (1), delay variation $\Delta$Delay is expressed by the following equation.

$$\Delta\text{Delay} = R_g(\Delta C_{wire}L_{wire} + \Delta C_{load}) + \Delta R_g(C_{wire}L_{wire} + C_{load}) + \frac{1}{2}(R_{wire}\Delta C_{wire} + \Delta R_{wire}C_{wire})L_{wire}^2 + (R_{wire}\Delta C_{load} + \Delta R_{wire}C_{load})L_{wire} \quad (2)$$

Here, when the variation caused by the total process variations is divided into wiring variation $\Delta_{wire}$ and gate variation $\Delta_g$, the wiring fluctuation $\Delta_{wire}$ and gate fluctuation $\Delta_g$ are expressed by the following equations.

$$\Delta_{wire} = R_g \Delta C_{wire} L_{wire} + \frac{1}{2}(R_{wire}\Delta C_{wire} + \Delta R_{wire} C_{wire})L_{wire}^2 + R_{wire}\Delta C_{load} L_{wire} \quad (3)$$

$$\Delta_g = R_g \Delta C_{load} + \Delta R_g(C_{wire}L_{wire} + C_{load}) + R_{wire}\Delta C_{load}C_{wire} \quad (4)$$

Here, regarding a local wiring, the capacitance load variations $\Delta C_{wire}$ and $\Delta C_{load}$ affect the delay time substantially, whereas wiring resistance component variations $\Delta R_{wire}$ and $\Delta R_{load}$ do not affect the delay time so much, so that the variations $\Delta_{wire}$ and $\Delta_g$ caused by process variations in the local wiring are expressed by the following equations.

$$\Delta_{wire} = (R_g + \frac{1}{2}R_{wire} L_{wire})\Delta C_{wire} L_{wire} \quad (5)$$

$$\Delta_g = (R_g + R_{wire} L_{wire})\Delta C_{load} \quad (6)$$

Therefore, the process variation sensitivity of a wiring delay with respect to the gate delay in the local wiring (LocalSensitivity) is defined by the following equation by utilizing the ratio of the total sum of the gate input load capacitance $C_{load}$ to the wiring capacitance $C_{wire}$ of the path from the source to the sink as a process variation sensitivity relating to the capacitance component.

$$\text{LocalSensitivity} = C_{wire} L_{wire}/C_{load} \quad (7)$$

On the other hand, regarding a global wiring, the wiring resistance component variations $\Delta R_{wire}$ and $\Delta R_{load}$ affect the delay time substantially, whereas the capacitor load variations $\Delta C_{wire}$ and $\Delta C_{load}$ do not affect the delay time so much, so that the variations $\Delta_{wire}$ and $\Delta_g$ caused by process variations in the global wiring are expressed by the following equations.

$$\Delta_{wire} = (\tfrac{1}{2} C_{wire} L_{wire} + C_{load}) \Delta R_{wire} L_{wire} \tag{8}$$

$$\Delta_g = (C_{wire} L_{wire} + C_{load}) \Delta R_g \tag{9}$$

Therefore, the process variation sensitivity of the wiring delay with respect to the gate delay in the global wiring (GlobalSensitivity) is defined by the following equation, by utilizing the ratio of the gate resistance $R_g$ to the wiring resistance $R_{wire}$ of the path from the source to the sink as a process variation sensitivity relating to a resistance component.

$$\text{GlobalSensitivity} = R_{wire} L_{wire}/R_g \tag{10}$$

Here, in general, in many cases the wiring has two or more fan-outs. In this case, the above-described definition of the process variation sensitivity corresponds to the approximation of the Elmore Delay Model by the characteristics of a path for directly connecting the source and the sink.

First Embodiment

In the first embodiment, an example will be described in detail in which the ratio of the total sum of a gate input load capacitance to the wiring capacitance of a path from a source to a sink is calculated as a process variation sensitivity relating to the capacitance component of the path and in which the calculated process variation sensitivities relating to the capacitor components of all paths are equalized, thereby optimizing the delay.

Figure 2:
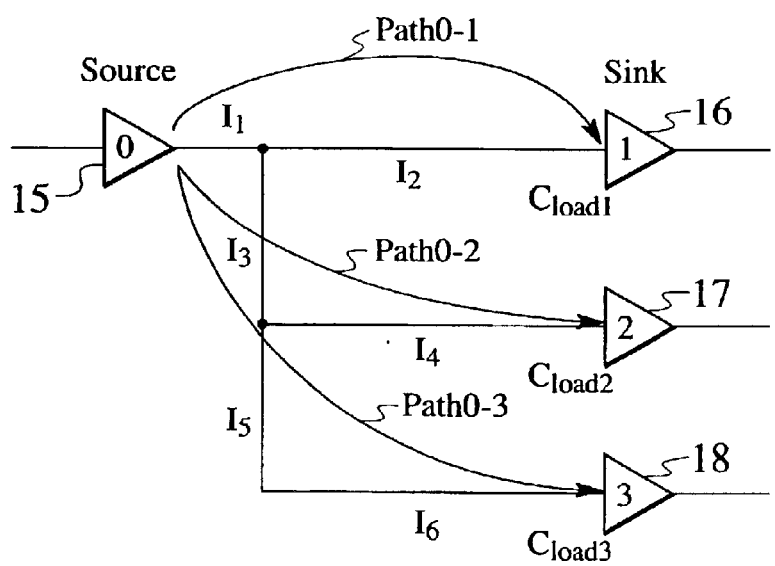
FIG. 2 is an illustration showing an example of a circuit having a signal path from a source to a sink, for explaining an example of the definition of a process variation sensitivity relating to a capacitance component.

FIG. 2 is an illustration showing a circuit having signal paths 0-1, 0-2, 0-3 from a source 0 (driver cell 15) to sinks 1, 2, 3 (driven cells 16, 17, 18). An example of calculating a process variation sensitivity relating to the capacitance component of the respective paths 0-1, 0-2, 0-3 is expressed by the following equation.

Path 0-1: $\{C_{wire}(l_1+l_2)\}/\Sigma C_{loadi}$,

Path 0-2: $\{C_{wire}(l_1+l_3+l_4)\}/\Sigma C_{loadi}$,

Path 0-3: $\{C_{wire}(l_1+l_3+l_5+l_6)\}/\Sigma C_{loadi}$. (11)

where $C_{wire}$ is a wiring load capacitance and $C_{loadi}$ (I=1, 2, 3) is an input capacitance of the driven cells 16 to 18, and $l_j$ (j=1, 2, 3, . . . , 6) is a wiring length (Manhattan length).

Figure 3A:
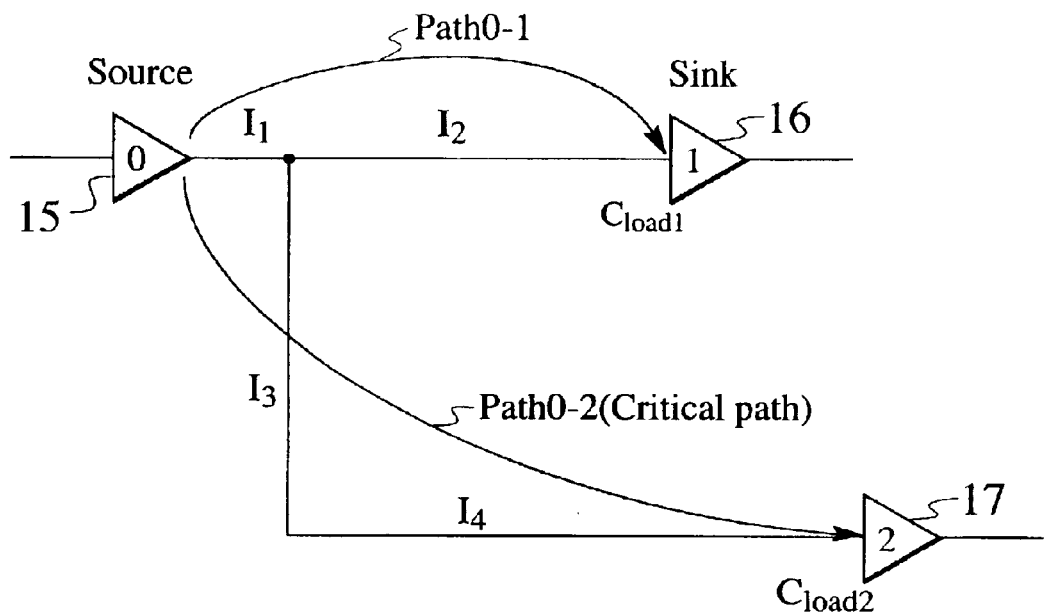
FIGS. 3A, 3B are illustrations each showing an example of a circuit having a signal path from a source to a sink, for explaining an example of calculating a process variation sensitivity relating to a capacitance component.

FIG. 3A is an illustration showing a circuit having signal paths 0-1, 0-2 from a source 0 (driver cell 15) to sinks 1, 2 (driven cells 16, 17). Here, assume that the path 0-2 is a path having a large delay (timing critical path). An example of calculating a process variation sensitivity relating to the capacitance component of the respective paths 0-1, 0-2 is expressed by the following equation.

Path 0-1: $\{C_{wire}(l_1+l_2)\}/(C_{load1}+C_{load2})$,

Path 0-2: $\{C_{wire}(l_1+l_3+l_4)\}/(C_{load1}+C_{load2})$. (12)

Figure 3B:
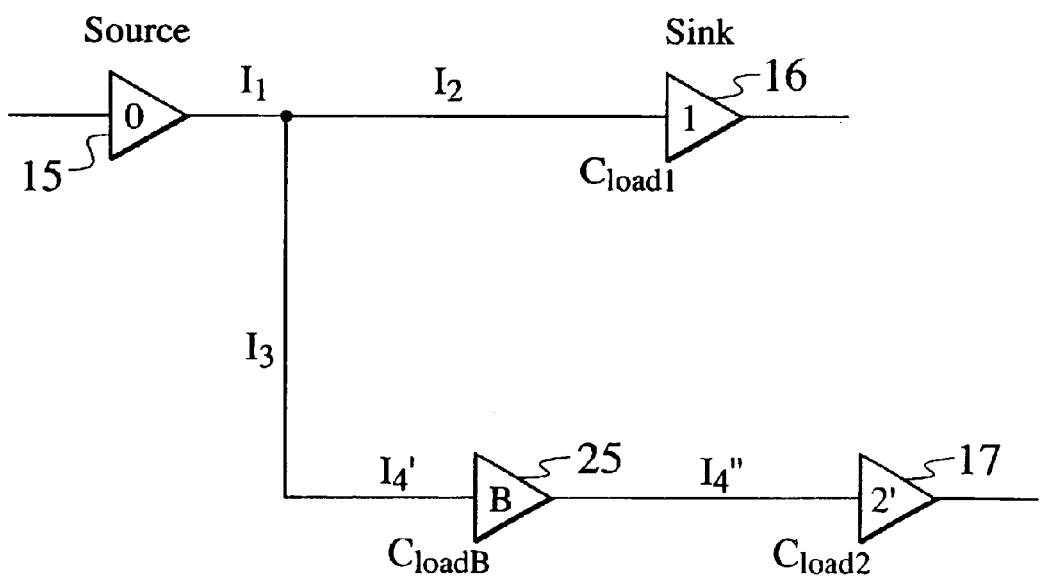

FIG. 3B is an illustration showing an example in which a buffer cell 25 is inserted into a critical path 0-2 to improve delay. An example of calculating a process variation sensitivity relating to the capacitance component of the respective paths 0-1, 0-2 after improving the delay is expressed by the following equation.

Figure 4A:
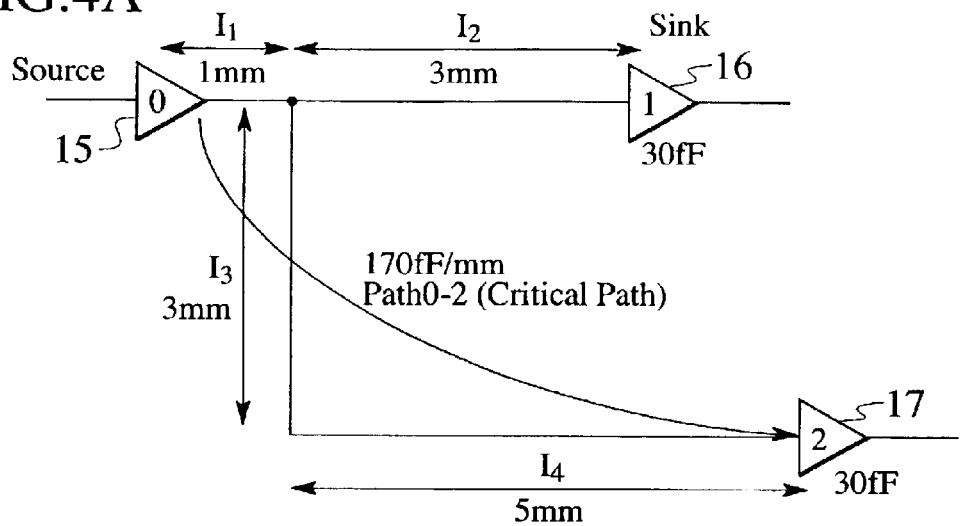
FIGS. 4A, 4B are illustrations each showing a circuit having a signal path from a source to a sink, for explaining an example of calculating a process variation sensitivity relating to a capacitance component.
Figure 4B:
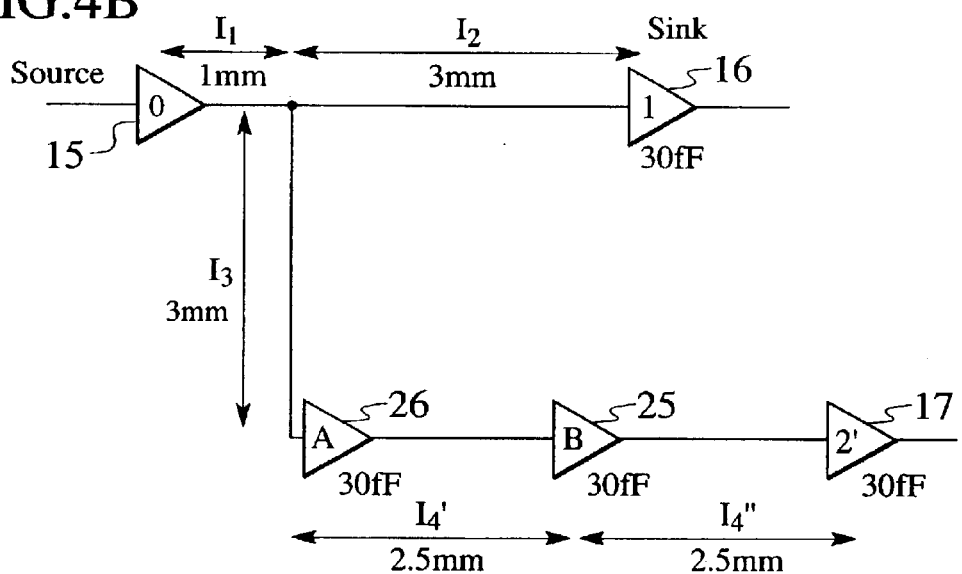

Path 0-1: $\{C_{wire}(l_1+l_2)\}/(C_{load1}+C_{load2})$,

Path 0-2': $\{C_{wire}(l_1+l_3+l_4')\}/(C_{load1}+C_{load2})+\{C_{wire}(l_4'')\}/C_{load}(13)$ FIGS. 4A, 4B show examples in which the process variation sensitivity is calculated by substituting numerical values for the examples shown in FIGS. 3A, 3B. The calculation result of the process variation sensitivity relating to the capacitance component of the respective paths 0-1, 0-2 in FIG. 4A is shown by the following equation.

$$\text{Path } 0-1: \{C_{wire}(l_1+l_2)\}/(C_{load1}+C_{load2}) = \{170 \, [\text{fF/mm}] \times (1 \, [\text{mm}] + 3 \, [\text{mm}])\}/60 \, [\text{fF}] \tag{14}$$
$$= 11.3,$$

$$\text{Path } 0-2: \{C_{wire}(l_1+l_3+l_4)\}/(C_{load1}+C_{load2}) = \{170 \, [\text{fF/mm}] \times (1 \, [\text{mm}] + 3 \, [\text{mm}] + 5 \, [\text{mm}])\}/60 \, [\text{fF}]$$
$$= 25.5.$$

In contrast, FIG. 4B shows an example in which a buffer cell 25 and a buffer cell 26 are inserted into a critical path 0-2' to divide the wiring length $l_4$ between wiring lengths $l_4'$ and $l_4''$ thereby improving delay.

Figures 4C, 4D:
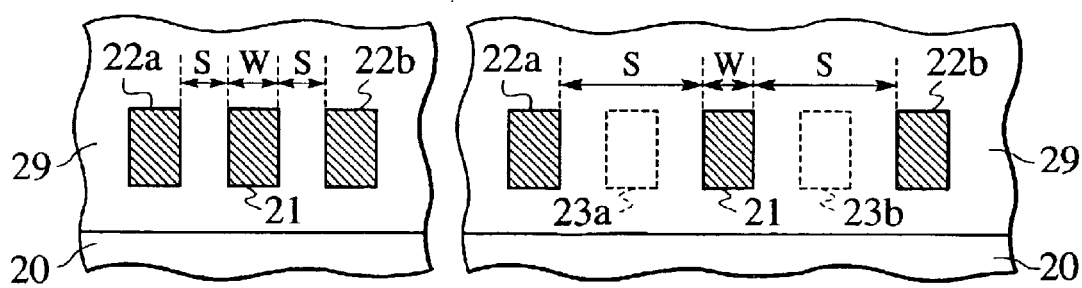
FIG. 4C shows wirings of the signal path before widening a wiring pitch.
FIG. 4D shows wirings of the signal path after widening a wiring pitch to optimize process variation sensitivity.

Further, the wiring pitch of the path 0-2' (after a branch of the path 0-1 and the path 0-2'), is widened to approximate the process variation sensitivity relating to the capacitance component of the path 0-2', to the process variation sensitivity of the path 0-1. FIG. 4C shows wirings 22a, 22b adjacent to the wiring 21 of the current path 0-2' before widening a wiring pitch S. FIG. 4D shows a wiring structure after widening the wiring pitch S by one wiring grid (grid 23a and grid 23b), for reducing mutual capacitance. Here, assuming that the ratio between the wiring capacitance component relative to a substrate, and the mutual capacitance component relative to the neighboring wirings stands at 4:6, the wiring load capacitance $C_{wire}$, after the branch of the path 0-1 and the path 0-2' is modeled from 170 fF/mm to 68 fF/mm.

The calculation result of a process variation sensitivity relating to the capacitance component after improving the process variation sensitivity relating to the capacitance component of the path 0-2', approximated to the process variation sensitivity of the path 0-1, as shown in FIGS. 4A to 4D, is shown by the following equation. It is clear from the result that the process variation sensitivity relating to the capacitance component of the path 0-2' is approximated to the process variation sensitivity of the path 0-1.

$$\text{Path } 0-1 := 11.3, \tag{15}$$

$$\text{Path } 0-2' := \{170 \text{ [fF/mm]} \times 1 \text{ [mm]} + 68 \text{ [fF/mm]} \times 3 \text{ [mm]}\}/60 \text{ [fF]} + \{68 \text{ [fF/mm]} \times$$
$$2.5 \text{ [mm]}\}/30 \text{ [}fF\text{]} + \{68 \text{ [fF/mm]} \times 2.5 \text{ [mm]}\}/30 \text{ [fF]}$$
$$= 6.27 + 5.7 + 5.7$$
$$= 17.6 \sim \text{Path } 0-1(11.3),$$

where, $C$ substrate : $C$ mutual $= 4:6$
$$= 68:102.$$

FIG. 5A shows an example in which a driver cell 27, which is a copy of a driver cell 15, is arranged adjacently to the driver cell 15, with respect to the example shown in FIG. 4B, to further reduce the process variation sensitivity relating to the capacitance component of the path 0-2'. As a result, the process variation sensitivity relating to the capacitance component of the path 0-2' is approximated to the process variation sensitivity of the path 0-1.

Still further, the wiring pitches of all wirings ($l_{0'}$–$l_3$–$l_{4'}$–$l_{4''}$) of the path 0-2' are widened to approximate the process variation sensitivity relating to the capacitance component of the path 0-2', to the process variation sensitivity of the path 0-1. FIG. 5B shows a wiring structure before widening the wiring pitch S and FIG. 5C shows a wiring structure after widening the wiring pitch S by one grid 23a, 23b, as is the case of the examples shown in FIG. 4C and FIG. 4D.

The calculation result of a process variation sensitivity relating to the capacitance component after improving the process variation sensitivity relating to the capacitance component of the path 0-2', approximated to the process variation sensitivity of the path 0-1, as shown in FIGS. 5A to 5C, is shown by the following equation. It is clear from the result that the process variation sensitivity relating to the capacitance component of the path 0-2' is increasingly approximated to the process variation sensitivity of the path 0-1.

predetermined range, it is possible to minimize delay variations caused by the process variations.

As described above, according to the first embodiment, it is possible to render the process variation sensitivities relating to the capacitance components to the same level in all paths from the source to the sinks. Thus, it is possible to reduce the variation of propagation delay of the respective paths to the predetermined range, irrespective of the process variations of the gates and wirings. In particular, in a local wiring in which the variation of the capacitance load is predominant for the propagation delay, it is possible to suppress the effect of the process variations to the propagation delay by making the process variation sensitivities relating to the capacitance component equal.

Second Embodiment

In the second embodiment, an example will be described in detail in which the ratio of gate resistance to the wiring resistance of a path from a source to a sink, is calculated as a process variation sensitivity relating to the resistance of the path, and in which the process resistance variations relating to the resistance component of all calculated paths are equalized to thereby optimize the delay.

Figure 7:
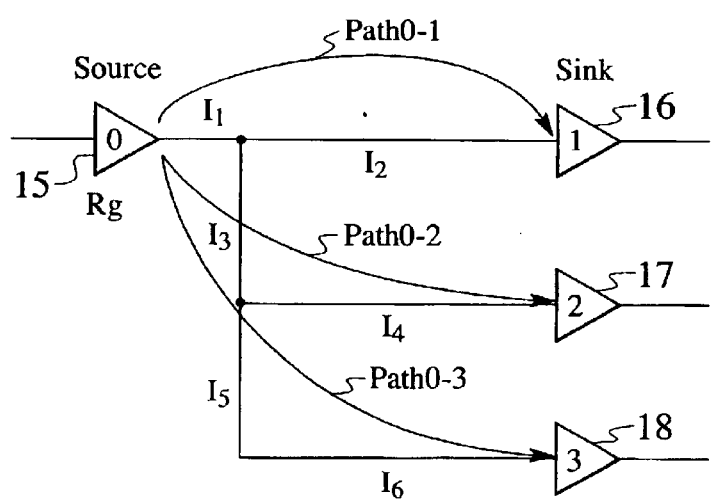
FIG. 7 is an illustration showing an example of a circuit having a signal path from a source to a sink, for explaining an example of the definition of a process variation sensitivity relating to a resistance component.

FIG. 7 is an illustration showing a circuit having signal paths 0-1, 0-2, 0-3 from a source 0 (driver cell) 15 to sinks $$\text{Path } 0-1 := 11.3, \tag{16}$$

$$\text{Path } 0-2' := \{68 \text{ [fF/mm]} \times 1 \text{ [mm]} + 68 \text{ [fF/mm]} \times 3 \text{ [mm]}\}/$$
$$60 \text{ [fF]} + \{68 \text{ [fF/mm]} \times 2.5 \text{[mm]}\}/30 \text{ [fF]} +$$
$$\{68 \text{ [fF/mm]} \times 2.5 \text{ [mm]}\}/30 \text{ [fF]}$$
$$= 4.5 + 5.7 + 5.7$$
$$= 15.9 \sim \text{Path } 0-1(11.3),$$

where, $C$ substrate : $C$ mutual $= 4:6$
$$= 68:102.$$

Figure 6:
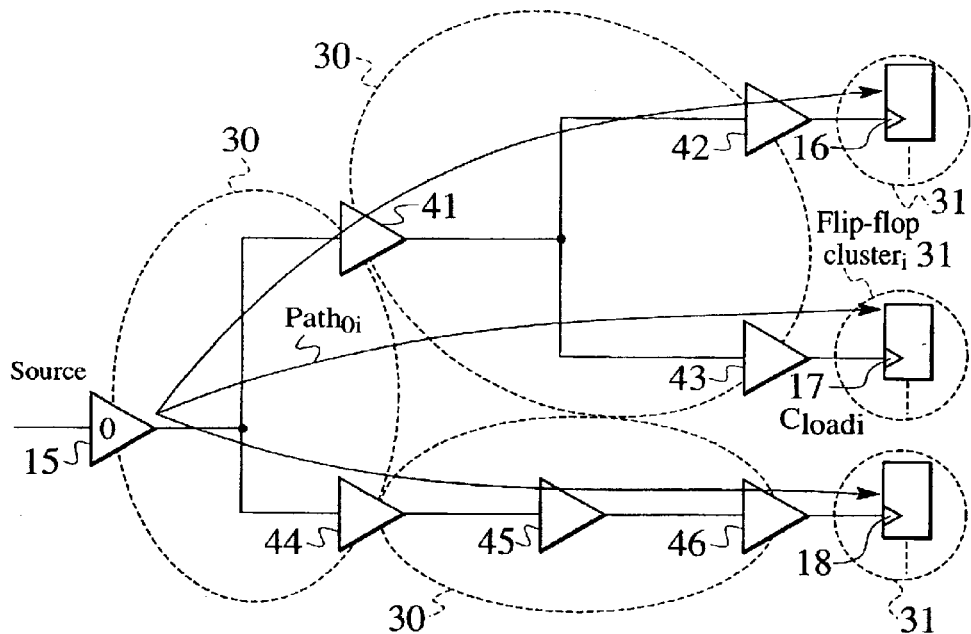
FIG. 6 is an illustration showing an example of a buffer tree generated by a Clock Tree Synthesis (CTS).

FIG. 6 shows an example of a buffer tree generated by a clock tree synthesis (CTS) and the range of a global wiring 30 and the range of a local wiring 31.

In the example shown in FIG. 6, buffer cells 41 to 46 (called a clock sub-driver), are hierarchically inserted between a route driver 15, which is a starting point and end terminals such as a memory 16, a flip-flop 17 and a micro cell 18. As a result, the load-balance is achieved according to the load capacitance of the respective paths $O_j$, and the clock skew is reduced.

Here, by reducing the total sum of process variation sensitivities of all paths, divided in the shape of a tree from the route driver 15 (source) to the end terminal sinks, to a 1, 2, 3 (driven cells 16, 17, 18). An example of calculating a process variation sensitivity relating to a resistance component of each of the paths 0-1, 0-2, 0-3 is expressed by the following equation.

$$\text{Path 0-1: } \{R_{wire}(l_1+l_2)\}/R_g,$$
$$\text{Path 0-2: } \{R_{wire}(l_1+l_3+l_4)\}/R_g,$$
$$\text{Path 0-3: } \{R_{wire}(l_1+l_3+l_5+l_6)\}/R_g. \tag{17}$$

where $R_{wire}$ is a wiring resistance, $R_g$ is a gate resistance, and $l_j$ (j=1, 2, 3, . . . , 6) is a wiring length (Manhattan length).

FIGS. 8A, 8B show examples in which the process variation sensitivity is calculated by actual numerical values. The calculation result of the process variation sensitivity relating to the resistance component of the respective paths 0-1, 0-2 in FIG. 8A is shown by the following equation.

$$\text{Path } 0-1 : \{R_{wire}(l_1 + l_2)\}/R_g = \{200\ [\Omega] \times (1\ [mm])\}/800\ [\Omega]$$
$$= 1.0,$$

$$\text{Path } 0-2 : \{R_{wire}(l_1 + l_3 + l_4)\}/R_g = \{200\ [\Omega] \times (1\ [mm] + 3\ [mm] + 5\ [mm])\}/800\ [\Omega]$$
$$= 2.25.$$

In contrast, FIG. 8B shows an example in which a buffer cell 25 and a buffer cell 26 are inserted into a critical path 0-2' to divide the wiring length $l_4$ between wiring lengths $l_4'$ and $l_4'$ thereby improving delay.

Further, the wiring width W of the path 0-2' (after a branch of the path 0-1 and the path 0-2'), is enlarged to approximate the process variation sensitivity relating to the resistance component of the path 0-2', to the process variation sensitivity of the path 0-1. FIG. 8C shows wirings 22a, 22b adjacent to the wiring 21 of the current path 0-2' before enlarging the wiring width W. FIG. 8D shows a wiring structure after enlarging the wiring width W twice.

The calculation result of a process variation sensitivity relating to the resistance component after improving the process variation sensitivity relating to the resistance component of the path 0-2', approximated to the process variation sensitivity of the path 0-1, as shown in FIGS. 8A to 8D, is shown by the following equation. It is clear from the result that the process variation sensitivity relating to the resistance component of the path 0-2' is approximated to the process variation sensitivity of the path 0-1.

$$\text{Path } 0-1 := 1.0, \tag{19}$$

$$\text{Path } 0-2' := \{200\ [\Omega] \times 1\ [mm] + 100\ [\Omega] \times 3\ [mm]\}/$$
$$800\ [\Omega] + \{100\ [\Omega] \times 2.5\ [mm]\}/800\ [\Omega] +$$
$$\{100\ [\Omega] \times 2.5\ [mm]\}/800\ [\Omega]$$
$$= 0.625 + 0.313 + 0.313$$
$$= 1.25 \sim \text{Path } 0-1(1.0).$$

FIG. 9A shows an example in which a driver cell 27, which is a copy of a driver cell 15, is arranged adjacently to the driver cell 15, with respect to the example shown in FIG. 8B, to further reduce the process variation sensitivity relating to the resistance component of the path 0-2'. As a result, the process variation sensitivity relating to the resistance component of the path 0-2' is approximated to the process variation sensitivity of the path 0-1.

Still further, the wiring pitches of all wirings ($l_{0'-3}$-$l_{4'}$-$l_{4''}$) of the path 0-2' are widened to approximate the process variation sensitivity relating to the resistance component of the path 0-2', to the process variation sensitivity of the path 0-1. FIG. 9B shows the wiring structure before enlarging the wiring width W and FIG. 9C shows the wiring structure after enlarging the wiring width W, as is the case of the examples shown in FIG. 8C and FIG. 8D.

The calculation result of a process variation sensitivity relating to the resistance component after improving the process variation sensitivity relating to the resistance component of the path 0-2', approximated to the process variation sensitivity of the path 0-1, as shown in FIGS. 8A to 8C, is shown by the following equation. It is clear from the result that the process variation sensitivity relating to the resistance component of the path 0-2' is increasingly approximated to the process variation sensitivity of the path 0-1.

(18)

$$\text{Path } 0-1 := 1.0, \tag{20}$$

$$\text{Path } 0-2' := \{100\ [\Omega] \times 1\ [mm] + 100\ [\Omega] \times 3\ [mm]\}/$$
$$800\ [\Omega] + \{100\ [\Omega] \times 2.5\ [mm]\}/800\ [\Omega] +$$
$$\{100\ [\Omega] \times 2.5\ [mm]\}/800\ [\Omega]$$
$$= 1.13 \sim \text{Path } 0-1(1.0).$$

As described above, according to the second embodiment, it is possible to render the process variation sensitivities relating to the resistance components to the same level in all paths from the source to the sinks. Thus, it is possible to reduce the variation of propagation delay of the respective paths to the predetermined range, irrespective of the process variations of the gates and wirings. In particular, in a global wiring in which the variation of the wiring resistance is predominant for the propagation delay, it is possible to suppress the effect of the process variations to the propagation delay by making the process variation sensitivities relating to the resistance component equal.

Third Embodiment

Figure 10:
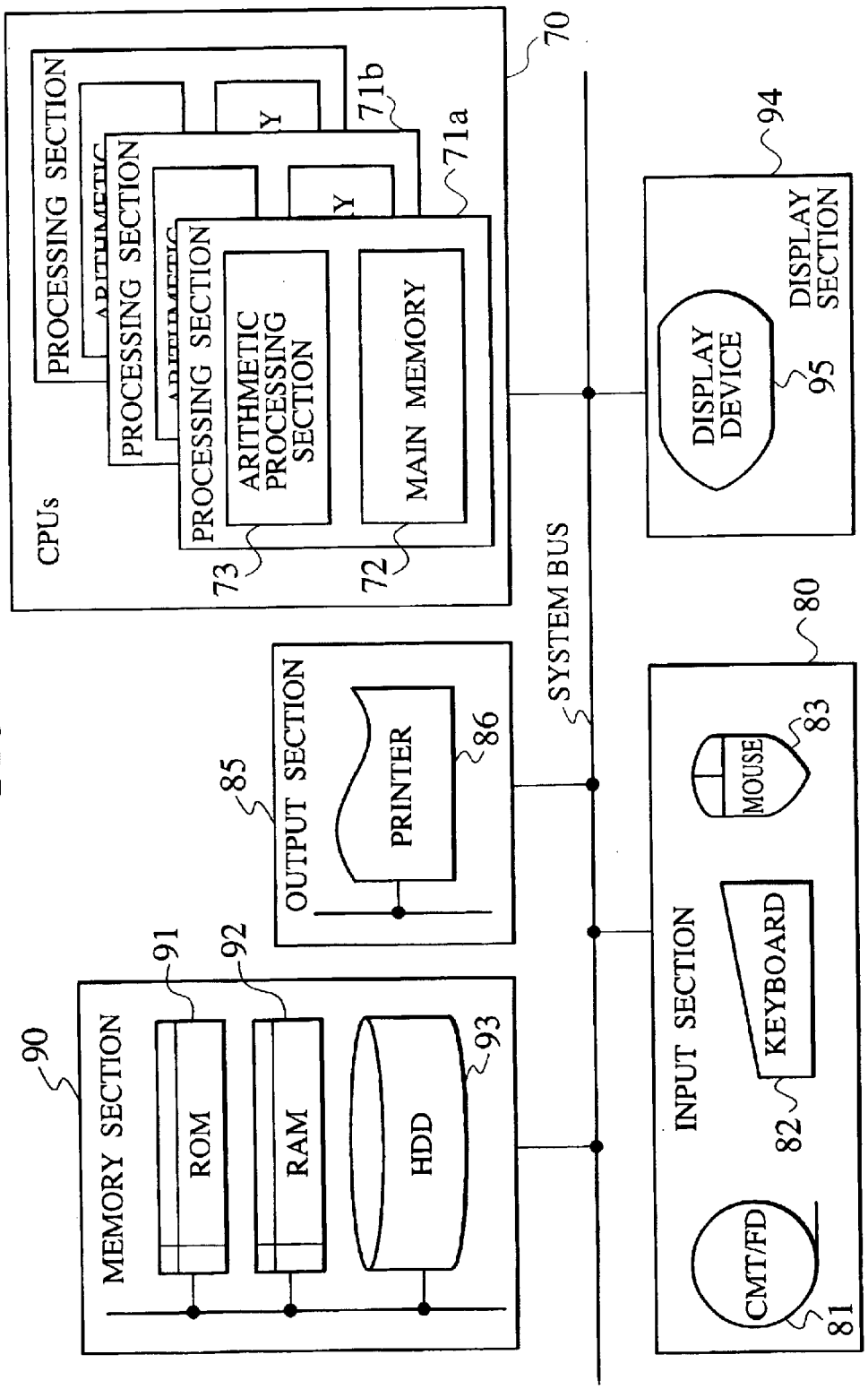
FIG. 10 is a schematic configuration showing an apparatus for designing a semiconductor circuit according to an embodiment of the present invention.

As shown in FIG. 10, a design apparatus for a semiconductor circuit according to the third embodiment of the present invention. This design apparatus includes a central processing unit(s) (CPU(s)) 70, an input section 80, an output section 85, a memory section 90, and a display device 95.

The CPU(s) 70 includes a multi-processor having a plurality of processing sections 71a, 71b, . . . each of which includes an arithmetic calculation section 73 and a main memory 72. The input section 80 includes an input device 81 which is a magnetic or optical recording medium such as a cartridge magnetic tape (CMT), a floppy disc or the like, and a keyboard 82 or a pointing device 83. The memory section 90 includes a read only memory (ROM) 91, a random access memory (RAM) 92 and a hard disc drive (HDD). The output section 85 includes a printer 86. The display section 94 includes a display device 95.

Figure 11A:
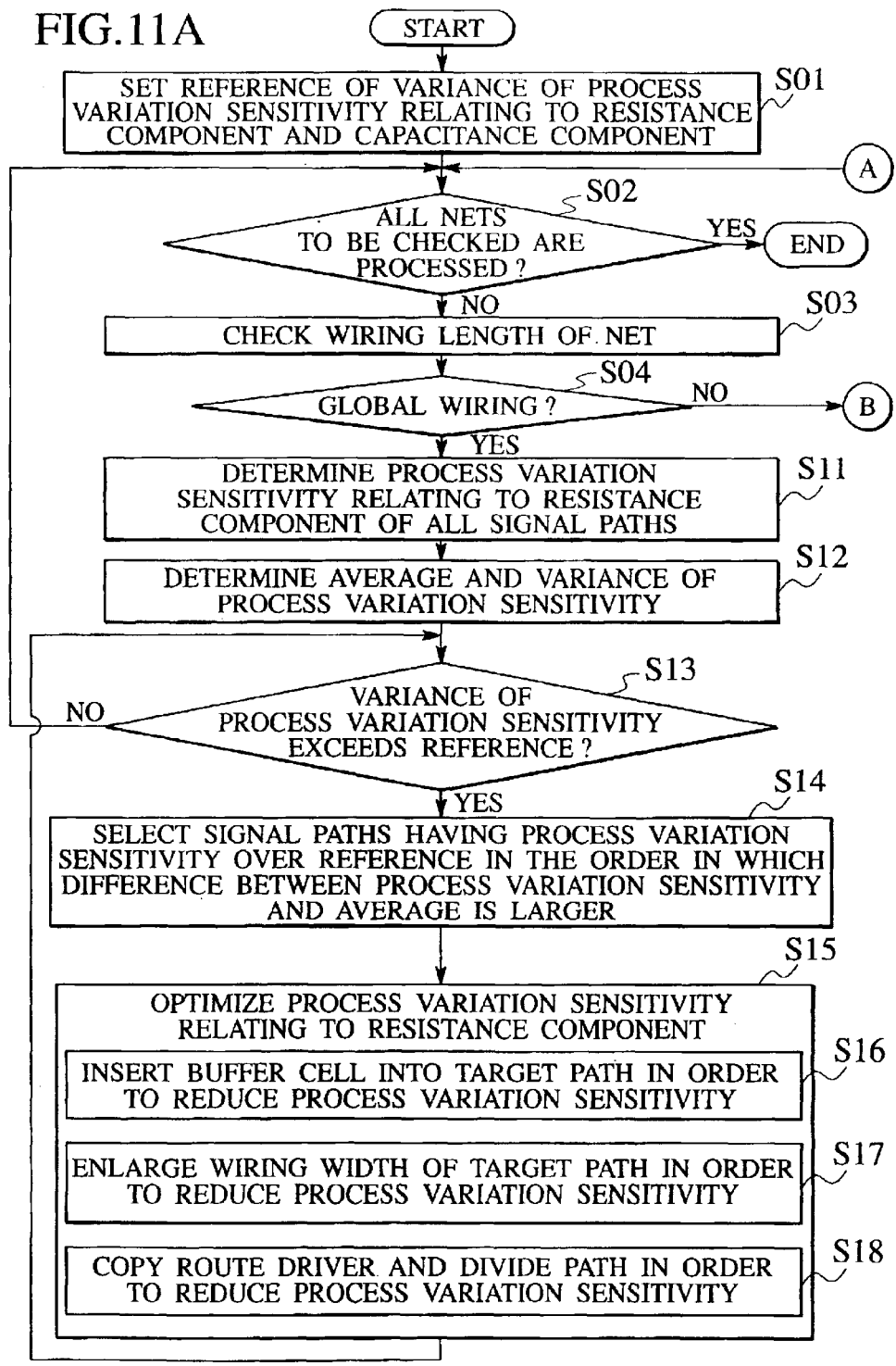
FIGS. 11A and 11B are flowcharts showing the processing procedures of designing a semiconductor circuit according to an embodiment of the present invention.
Figure 11B:
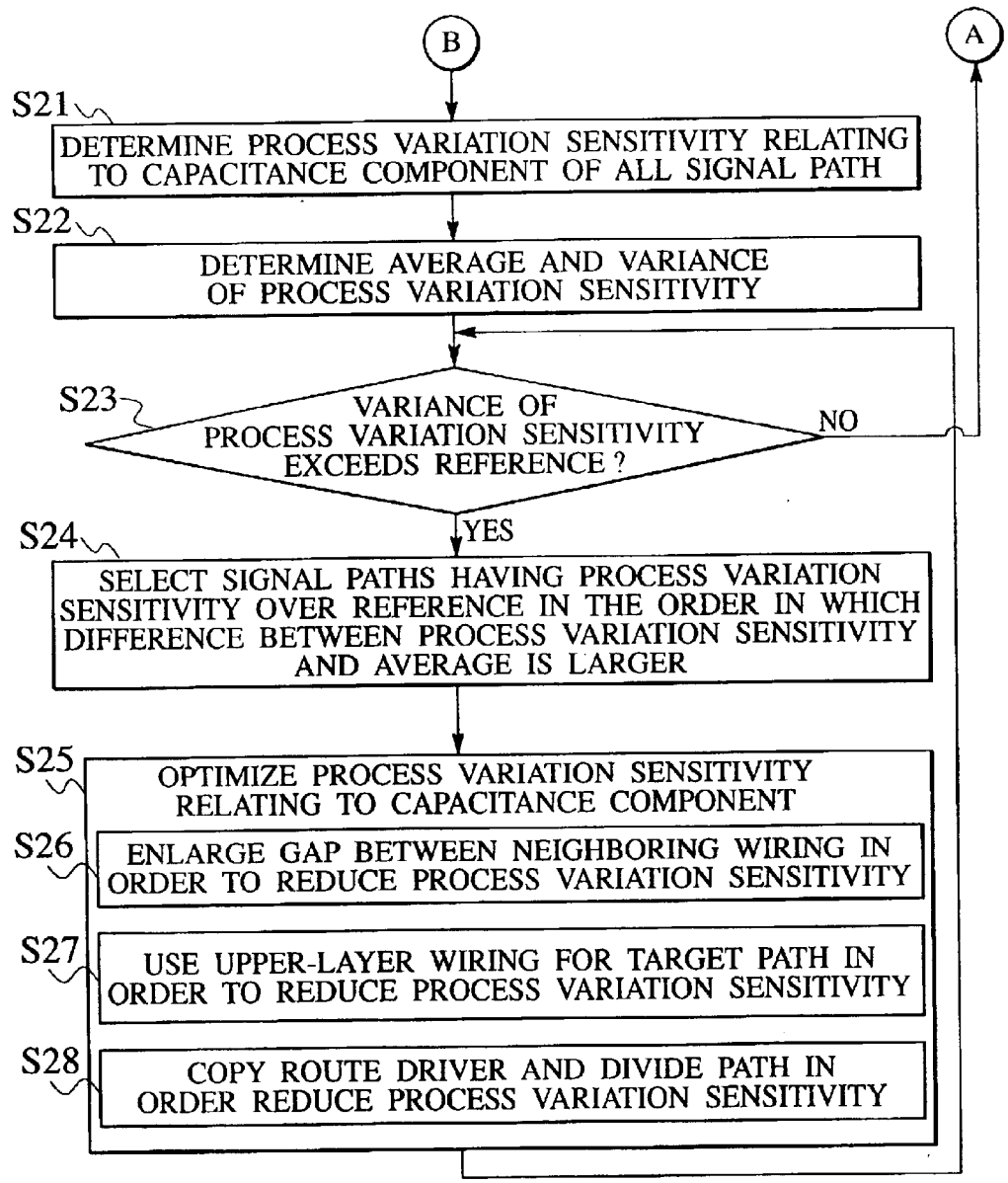

The present design apparatus for the semiconductor circuit receives a design program for the semiconductor circuit in which the processing procedures of the flowcharts shown in FIG. 11a to FIG. 11b are described via the input section 80, and installs the design program into the memory section 90. The CPU(s) 70 of the design apparatus perform a series of processing operations relating to the design of the semiconductor circuit according to the processing procedure described in the installed design program.

Further, when the present design apparatus performs the design processing of the semiconductor circuit, the design apparatus receives circuit design information including a net list of a gate level and various kinds of library information via the input section 80, and stores the circuit design information in the memory section 90. The library information includes a geometrical library that defines the size/shape/wiring-layer of cells or pins, a technology library such as the capacitances of pins and the sheet resistances and capacitances of wirings, and a performance library that describes the on-resistance and input/output of a gate in each logic cell.

The processing sections 71*a*, 71*b*, . . . calculate the ratio of a gate resistance to the wiring resistance, as a process variation sensitivity relating to the resistance component based on the circuit design information stored in the memory section 90, and optimizes the process variation sensitivity relating to the resistance component of each path in order that the process variation sensitivities relating to the resistance components of all the paths are smaller than a reference value. The processing sections 71*a*, 71*b*, . . . further calculate the ratio of a gate resistance to the wiring resistance, as a process variation sensitivity relating to the resistance component based on the circuit design information stored in the memory section 90, and optimize the process variation sensitivity relating to the resistance component of each path in order that the process variation sensitivities relating to the resistance components of all the paths are smaller than a reference value.

As shown in FIGS. 11*a* and 11*b*, in Step S01, the CPU(s) 70 of the design apparatus sets the reference values of variance of the process variation sensitivities relating to both a capacitance component and a wiring resistance.

Next, in Step S02, the CPU(s) 70 judges whether or not all nets to be designed are processed, and if the processing of all the nets are completed, the CPU(s) 70 finishes the processing.

Figure 12:
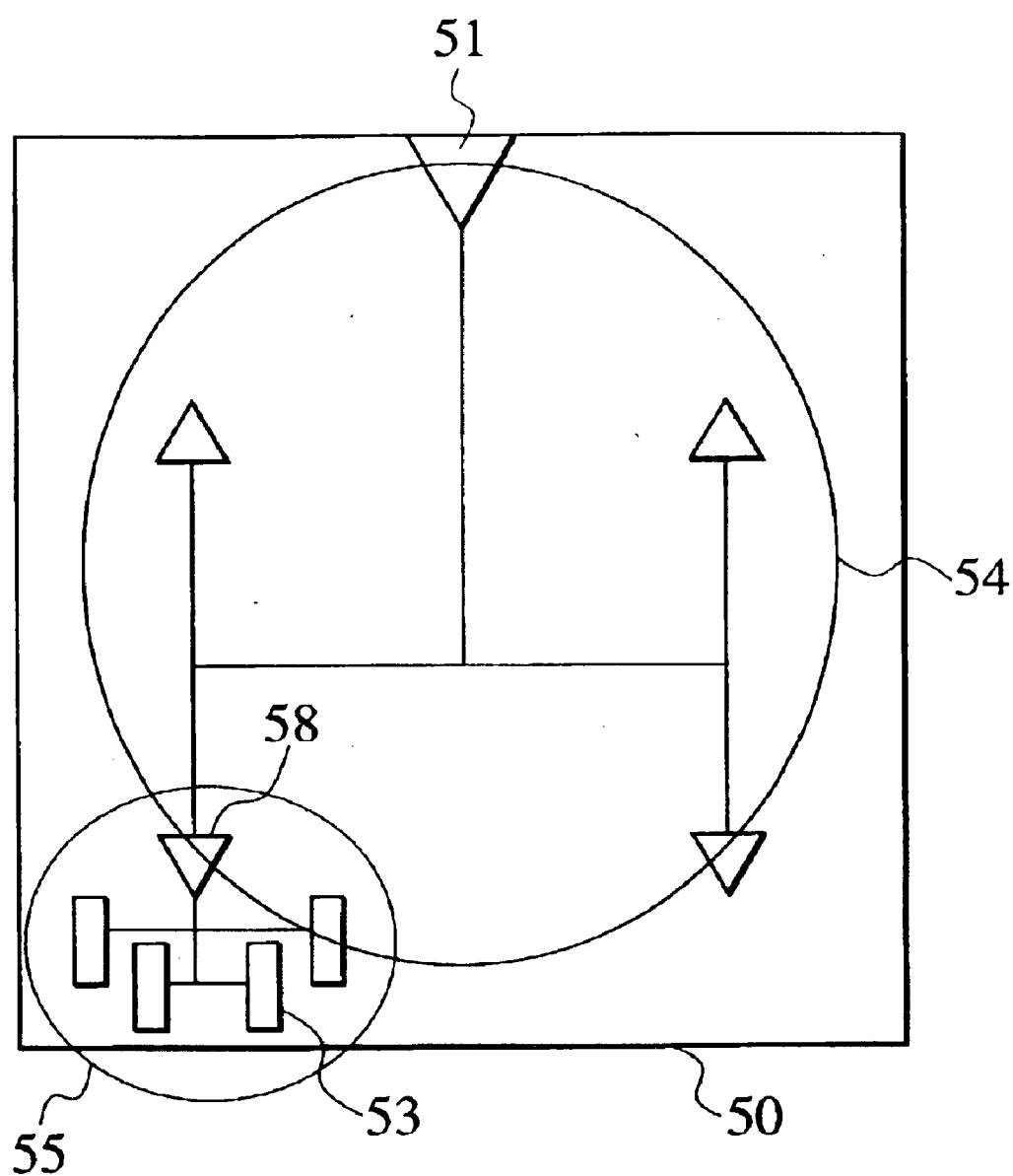
FIG. 12 is an illustration for explaining a global wiring and a local wiring.

Then, in Step S03, the CPU(s) 70 checks the wiring length of nets to be designed. Further, in Step S04, the CPU(s) 70 judges whether the wiring of nets to be designed is a global wiring or a local wiring. The local wiring is a wiring having a short wiring length, for example, shorter than 1 mm and the global wiring is a wiring having a long wiring length, for example, not shorter than 1 mm. Taking a semiconductor chip 50 shown in FIG. 12 as an example, a wiring from a clock route driver 51 to a clock sub-driver 58 is a global wiring, and a wiring from the clock sub-driver 58 to a flip-flop 53 at the terminals is a local wiring.

Depending on the result of Step S04, in the case where the wiring is a global wiring, the variance of the resistance component of the wiring affects a delay time substantially, so that, in Step S11, the CPU(s) 70 calculates a process variation sensitivity relating to the resistance component of all paths of the net to be designed.

Then, in Step S12, the CPU(s) 70 calculates the average and the variance of the calculated process variation sensitivities relating to the resistance component.

Then, in Step S13, the CPU(s) 70 determines whether or not the variance of the calculated process variation sensitivity relating to the resistance component exceeds the reference value previously set at the Step S01. If the calculated variance of the process variation sensitivity does not exceed the reference value, the CPU(s) 70 returns the procedure to the Step S02 to perform the next net.

On the other hand, Depending on the result of Step S13, if the calculated variance of the process variation sensitivity relating to the resistance component exceeds the reference value, in Step S14, the CPU(s) 70 selects signal paths having the process variation sensitivity exceeding the reference value in the order in which the difference between the process variation sensitivity and the average value is larger.

Then, in Step S15, the CPU(s) 70 performs optimization of the process variation sensitivity relating to the resistance component for the selected path. This optimization procedure of Step S15 includes the following steps S16 to S18: the CPU(s) 70 performs the following steps S16 to S18 selectively.

(1) In Step S16, the CPU(s) inserts a buffer cell into the selected path in order to reduce the process variation sensitivity relating to the resistance component.

(2) In Step S17, the CPU(s) enlarges the wiring width of the selected path in order to reduce the process variation sensitivity relating to the resistance component.

(3) In Step S18, the CPU(s) copies a route driver and divides the selected path in order to reduce the process variation sensitivity relating to the resistance component.

The CPU(s) performs the optimization of the process variation sensitivity relating to the resistance component for the selected path in the manner described above, and then the CPU(s) returns the procedure again to Step S13. In other word, the processing from Step S13 to the Step S18 is repeated until the variance of the process variation sensitivity relating to the resistance component becomes smaller than the reference value.

On the other hand, depending on the result of Step S04, in the case where the wiring is judged a local wiring, the variance of the capacitance load affects a delay time substantially, so that, in Step S21, the CPU(s) 70 calculates a process variation sensitivity relating to a capacitance component of all paths of the net to be designed.

Then, in Step S22, the CPU(s) 70 calculates the average and the variance of the calculated process variation sensitivities relating. to the determined capacitance component.

Then, in Step S23, the CPU(s) 70 determines whether or not the calculated variance of the process variation sensitivity relating to the capacitance component exceeds the reference value previously set at Step S01. If the calculated variance of the process variation sensitivity does not exceed the reference value, the CPU(s) 70 returns the procedure to the Step S02 to perform the next net.

On the other hand, Depending on the result of Step S23, if the calculated variance of the process variation sensitivity relating to the capacitance component exceeds the reference value, in Step S24, the CPU(s) 70 selects signal paths having the process variation sensitivity exceeding the reference value in the order in which the difference between the process variation sensitivity and the average value is larger.

Then, in Step S25, the CPU(s) 70 performs optimization of the process variation sensitivity relating to the capacitance component for the selected path. This optimization procedure of Step S25 includes the following steps S26 to S28: the CPU(s) 70 performs the following steps S26 to S28 selectively.

(1) In Step S26, the CPU(s) widens a gap between neighboring wirings of the selected signal path in order to reduce the process variation sensitivity relating to the capacitance component.

Figure 13:
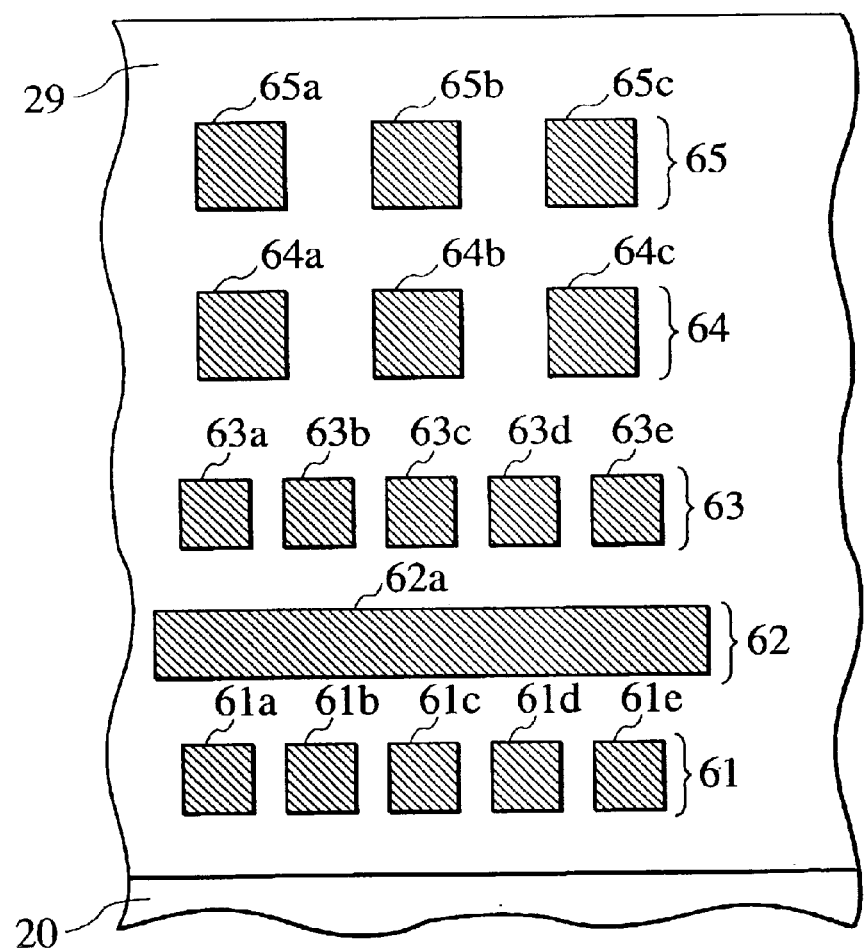
FIG. 13 is an illustration for explaining an upper wiring layer and a lower wiring layer.

(2) In Step S27, the CPU(s) uses an upper wiring layer of the selected signal path in order to reduce the process variation sensitivity relating to the capacitance component. Here, the upper wiring layer, in the case of the five-layer wiring as shown in FIG. 13, means the layers from the third layer 63 to the fifth layer 65 are far from the substrate 20 whereas lower wiring layer means the layers of the first layer 61 and the second layer 62 are near to the substrate 20. In general, the upper wiring layer which is farther from the substrate 20 has a smaller capacitance with respect to the substrate 20, hence can reduce a wiring capacitance itself, as compared with the lower wiring layer. Therefore, the use of the upper wiring layer can reduce the process variation sensitivity relating to the capacitance component.

(3) In Step S27, the CPU(s) copies a route driver and divides the selected path in order to reduce the process variation sensitivity relating to the capacitance component.

The CPU(s) performs the optimization of the process variation sensitivity relating to the capacitance component for the selected path in the manner described above, and then the CPU(s) returns the procedure again to Step S13. In other words, the processing from Step S13 to Step S18 is repeated until the variance of the process variation sensitivity relating to the capacitance component becomes smaller than the reference value.

The above-described processing is performed for all the nets to be designed to set the process variation sensitivities relating to the capacitance component and the resistance component within the predetermined reference values for each net. Therefore, it is possible to design a semiconductor circuit capable of suppressing the effect of the variation of propagation delay caused by the process variations.

Although the embodiments of the present invention have been described in detail, the invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A computer-implemented method for designing a semiconductor integrated circuit, which optimizes the propagation delay oh path from a signal input terminal called a source, to a signal output terminal called a sink, on the same net, the method comprising:

calculating the ratio of the total sum of a gate input load capacitance to the wiring capacitance of the path from the source to the sink as a process variation sensitivity relating to the capacitance component of the path to be designed from the source to the sink, based on a circuit design information of a gate level of the semiconductor integrated circuit to be designed; and optimizing the process variation sensitivity relating to the capacitance component of each path by enlarging a gap between neighboring wirings and adjusting a wiring capacitance load for a path in which the process variation sensitivity relating to the capacitance component is larger than the reference value in order to reduce the process variation sensitivity relating to the capacitance component of the path in order that the process variation sensitivities relating to the capacitance components of all the paths are smaller than a reference value.

2. The method of claim 1, wherein the wiring capacitance load is adjusted by using an upper wiring layer for the path in which the process variation sensitivity relating to the capacitance component is larger than the reference value.

3. The method of claim 1, wherein the wiring capacitance load is adjusted by copying a cell to be a route driver and by dividing the path in which the process variation sensitivity relating to the capacitance component is larger than the reference value.

4. The method of claim 1, wherein the optimization of the process variation sensitivity relating to the capacitance component is performed when the wiring structure in the net is a local wiring.

5. A computer-implemented method for designing a semiconductor integrated circuit, which optimizes the propagation delay of a path from a signal input terminal called a source, to a signal output terminal called a sink, on the same net, the method comprising:

calculating the ratio of a gate resistance to the wiring resistance of the path from the source to the sink as a process variation sensitivity relating to the resistance component of the path to be designed from the source to the sink, based on a circuit design information of a gate level of the semiconductor integrated circuit to be designed; and optimizing the process variation sensitivity relating to the resistance component of each path by enlarging a wiring width and adjusting a wiring resistance load for a path in which the process variation sensitivity relating to the resistance component is larger than the reference value in order to reduce the process variation sensitivity relating to the resistance component of the path order that the process variation sensitivities relating to the resistance components of all the paths are smaller than a reference value.

6. The method of claim 5, wherein the wiring resistance load is adjusted by inserting a buffer cell into the path in which the process variation sensitivity relating to the resistance component is larger than the reference value.

7. The method of claim 5, wherein the wiring resistance load is adjusted by copying a cell to be a route driver and by dividing the path for a path in which the process variation sensitivity relating to the resistance component is larger than the reference value.

8. The method of claim 5, wherein the optimization of the process variation sensitivity relating to the resistance component is performed when the wiring structure in the net is a global wiring.

9. An apparatus for designing a semiconductor integrated circuit, which optimizes the propagation delay oh path from a signal input terminal called a source, to a signal output terminal called a sink, on the same net, the apparatus comprising:

a memory section configured to store a circuit design information of a gate level of the semiconductor integrated circuit to be designed;

a processing section configured to calculate the ratio of the total sum of a gate input load capacitance to the wiring capacitance of the path from the source to the sink as a process variation sensitivity relating to the capacitance component of the path to be designed from the source to the sink, based on the circuit design information and to optimize the process variation sensitivity relating to the capacitance component of each path by enlarging a gap between neighboring wiring and adjusting a wiring capacitance load for a path in which the process variation sensitivity relating to the capacitance component is larger than the reference value in order to reduce the process variation sensitivity relating to the capacitance component of the path in order that the process variation sensitivities relating to the capacitance components of all the paths are smaller than a reference value.

10. The apparatus of claim 9, wherein the processing section adjusts the wiring capacitance load by using an upper wiring layer for the path in which the process variation sensitivity relating to the capacitance component is larger than the reference value.

11. The apparatus of claim 9, wherein the processing section adjusts the wiring capacitance load by copying a cell to be a route driver and by dividing the path in which the process variation sensitivity relating to the capacitance component is larger than the reference value.

12. The apparatus of claim 9, wherein the processing section performs the optimization of the process variation sensitivity relating to the capacitance component when the wiring structure in the net is a local wiring.

13. An apparatus for designing a semiconductor integrated circuit, which optimizes the propagation delay of a path from a signal input terminal called a source, to a signal output terminal called a sink, on the same net, the apparatus comprising:

a memory section configured to store a circuit design information of a gate level of the semiconductor integrated circuit to be designed;

a processing section configured to calculate the ratio of a gate resistance to the wiring resistance of the path from the source to the sink as a process variation sensitivity relating to the resistance component of the path to be designed from the source to the sink, based on the circuit design information and to optimize the process variation sensitivity relating to the resistance component of each path by enlarging a wiring width and adjusting a wiring resistance load for a path in which the process variation sensitivity relating to the resistance component is larger than the reference value in order to reduce the process variation sensitivity relating to the resistance component of the path in order that the process variation sensitivities relating to the resistance components of all the paths are mailer than a reference value.

14. The apparatus of claim 13, wherein the processing section adjusts the wiring resistance load by inserting a buffer cell into the path in which the process variation sensitivity relating to the resistance component is larger than the reference value.

15. The apparatus of claim 13, wherein the processing section adjusts the wiring resistance load by copying a cell to be a route driver and by dividing the path for a path in which the process variation sensitivity relating to the resistance component is larger than the reference value.

16. The apparatus of claim 13, wherein the processing section performs the optimization of the process variation sensitivity relating to the resistance component when the wiring structure in the net is a global wiring.

17. A program for designing a semiconductor integrated circuit, which optimizes the propagation delay of a path from a signal input terminal called a source, to a signal output terminal called a sink, on the same net, the program comprising:

determining a wiring structure in the net by obtaining a wiring length in the net based on a circuit design information of a gate level of the semiconductor integrated circuit to be designed;

calculating the ratio of the total sum of a gate input load capacitance to the wiring capacitance of the path from the source to the sink as a process variation sensitivity relating to the capacitance component of the path to be designed from the source to the sink, based on the circuit design information, enlarging a gap between neighboring wirings and adjusting a wiring capacitance load for a path in which the process variation sensitivity relating to the capacitance component is larger than a reference valve, to reduce the process variation sensitivity relating to the capacitance component of the path, to thereby optimize the process variation sensitivity relating to the capacitance component of each path in order that the process variation sensitivities relating to the capacitance components of all the paths are smaller than the reference value in the case where the wiring structure in the net is a local wiring; and calculating the ratio of a gate resistance to the wiring resistance of the path from the source to the sink as a process variation sensitivity relating to the resistance component of the path to be designed from the source to the sink, based on the circuit design information, enlarging a wiring width and adjusting a wiring capacitance load for a path in which the process variation sensitivity relating to the resistance component is larger than a reference value, to reduce the process variation sensitivity relating to the resistance component of the path, to thereby optimize the process variation sensitivity relating to the resistance component of each path in order that the process variation sensitivities relating to the resistance components of all the paths are smaller than the reference value in the case where the wiring structure in the net is a global wiring.

* * * * *